United States Patent
Akiyoshi

(10) Patent No.: US 7,167,409 B2
(45) Date of Patent: Jan. 23, 2007

(54) SEMICONDUCTOR MEMORY DEVICE

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/085,471

(22) Filed: Mar. 22, 2005

(65) Prior Publication Data
US 2006/0126417 A1   Jun. 15, 2006

(30) Foreign Application Priority Data
Dec. 13, 2004   (JP)   ............... 2004-360384

(51) Int. Cl.
*G11C 8/00* (2006.01)
(52) U.S. Cl. ............. 365/230.03; 365/189.01; 365/191
(58) Field of Classification Search ........... 365/230.03, 365/189.01, 191, 189.07, 194, 189.05
See application file for complete search history.

(56) References Cited

U.S. PATENT DOCUMENTS 6,760,242 B1 * 7/2004 Park et al. ............ 365/49

2004/0057304 A1 * 3/2004 Smits ............ 365/200

FOREIGN PATENT DOCUMENTS

| JP | 58-199490 | 11/1983 |
| JP | 10-269765 | 10/1998 |
| JP | 2004-79077 | 3/2004 |

* cited by examiner

Primary Examiner—Richard Elms
Assistant Examiner—Dang Nguyen
(74) Attorney, Agent, or Firm—Arent Fox PLLC

(57) ABSTRACT

A cell array in the semiconductor memory device is divided into two blocks. Each of control signal lines for transmission of control signals are also divided into a first portion and a second portion correspondingly to the blocks. A repeater circuit that relays a control signal is provided between the two portions. The repeater circuit does not output the control signal from the first portion to the second portion, as long as a block that receives the control signal via the first portion is selected.

13 Claims, 11 Drawing Sheets

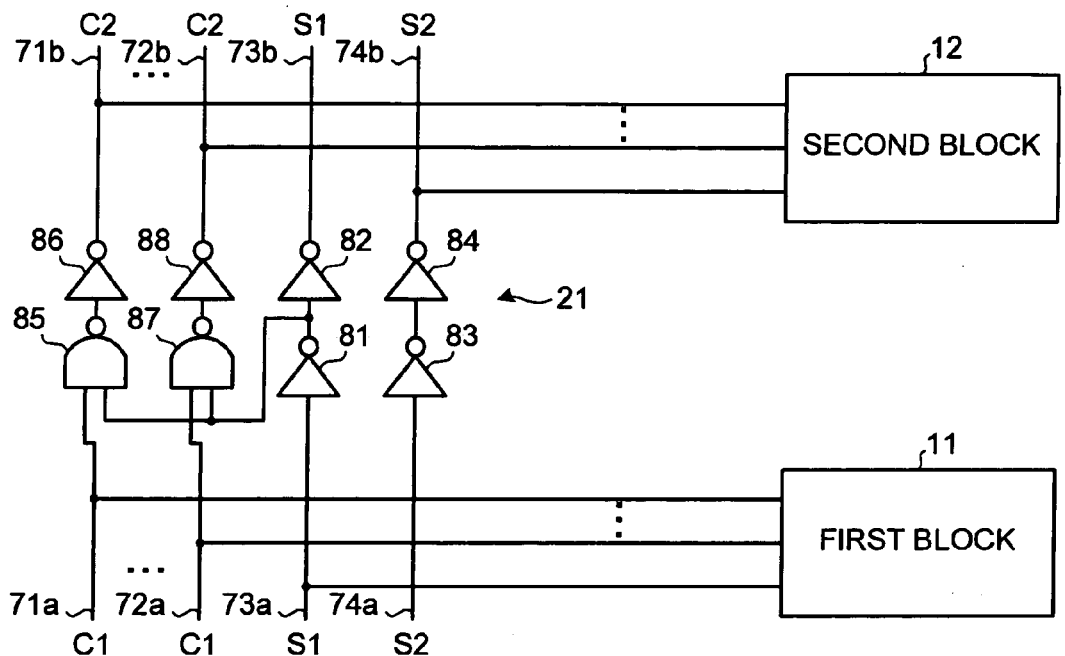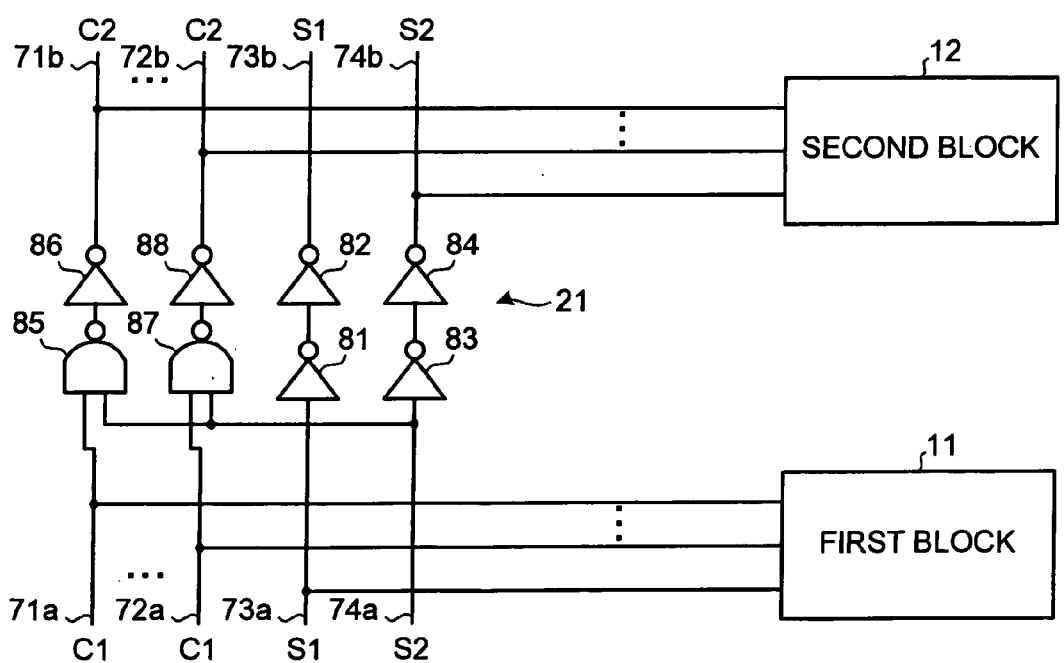

SEMICONDUCTOR MEMORY DEVICE

CROSS-REFERENCE TO RELATED APPLICATIONS

This application is based upon and claims the benefit of priority from the prior Japanese Patent Application No.2004-360384, filed on Dec. 13, 2004, the entire contents of which are incorporated herein by reference.

BACKGROUND OF THE INVENTION

1) Field of the Invention

The present invention relates to semiconductor memory devices such as a static random access memory (SRAM) having a repeater circuit.

2) Description of the Related Art

Recently, there has been a considerable increase in the capacity of SRAM macros included in semiconductor chips. As a result, longer decoder lines, bit lines, write signal lines, and read signal lines are required. However, the longer signal lines cause a delay in signal propagation speed and an increase in power consumption. One approach to avoid the decrease in the signal propagation speed is to divide a cell array in the SRAM macro into a plurality of blocks, divide the various signal lines mentioned above, and insert a repeater circuit between the lines.

For example, conventional semiconductor memory devices are known that have a cell array divided into a plurality of blocks (for example, refer to Japanese Patent Laid-Open Publication No. 2004-79077). Such a semiconductor memory device includes a plurality of memory blocks, a plurality of data buses, a plurality of buffer circuits, a block activating circuit, and buffer controlling circuits. The data buses are provided for each of the memory blocks. The buffer circuits are provided for each of the memory blocks and connects the data buses in series by relaying data on the data buses. The block activating circuit outputs a plurality of block selection signals for each of the memory blocks and selectively activates a memory block by asserting a block selection signal. The buffer controlling circuits are provided for each of the memory blocks and activate a buffer circuit when the corresponding block selection signal is asserted or when a buffer circuit in a memory block adjacently located in an upstream direction on a data bus is activated.

Semiconductor memory devices having a different configuration are also known (for example, refer to Japanese Patent Laid-Open Publication No. S58-199490). In such a semiconductor memory device, an internal data bus is divided into a plurality of buses, and these buses are coupled by a multi-directional information transferring unit capable of separating the divided buses based on their capacities and allowing mutual signal transfer among these buses.

Other semiconductor memory devices having a different configuration are also known (for example, refer to Japanese Patent Laid-Open Publication No. H10-269765). Such a semiconductor memory device includes a plurality of memory mats, a master control circuit, a plurality of local control circuits, and a buffer unit. Each of the memory mats has a plurality of memory cells disposed in a matrix format. The master control circuit generates, for the memory mats in common, an internal address signal and an internal control signal according to an external signal including an address signal. The local control circuits are respectively provided for the memory mats, and controls an access operation to a memory cell of a corresponding memory mat according to the internal address signal and the internal control signal from the master control circuit. The buffer unit is provided between the master control circuit and each of the local control circuit, and performs a buffer process on a signal from the master control circuit for transfer to each of the local control circuit.

A conventional semiconductor memory device having a cell array divided into a plurality of blocks and having a repeater circuit as described above is described below. FIG. 1 is a block diagram of the relevant parts of such a conventional semiconductor memory device having a cell array divided into two blocks, that is, a first block 1 and a second block 2. [N+2] signal lines are provided, including n control signal lines (3*a* and 3*b*; and 4*a* and 4*b*) (in FIG. 1, only two control lines are shown), a first block selection signal line (5*a* and 5*b*) for selecting the first block 1, and a second block selection signal line (6*a* and 6*b*) for selecting the second block 2.

The n control signal lines (3*a* and 3*b*; and 4*a* and 4*b*) transmit a word selection signal, a column selection signal, a read control signal, a write control signal, etc., respectively. The first block selection signal line (5*a* and 5*b*) transmits a signal for selecting the first block 1 (hereinafter, "a first block selection signal"), and the second block selection signal line (6*a* and 6*b*) transmits a signal for selecting the second block 2 (hereinafter, "a second block selection signal").

The n control signal lines (3*a* and 3*b*; and 4*a* and 4*b*), the first block selection signal line (5*a* and 5*b*), and the second block selection signal line (6*a* and 6*b*) are respectively divided, by a pair of inverters 7 and 8 connected in series, into two portions. One is first portions 3*a*, 4*a*, 5*a*, and 6*a* which are connected to the first block 1, and the other is second portions 3*b*, 4*b*, 5*b*, and 6*b* which are connected to the second block 2. The [n+2] pairs of inverters 7 and 8 form a repeater circuit 9.

In the structure shown in FIG. 1, the first block 1 is selected when the first block selection signal on the first portion 5*a* of the first block selection signal line (5*a* and 5*b*) is asserted. Normally at this time, the second block selection signal on the second block selection line (6*a* and 6*b*) is negated (in other words, the second block 2 is not selected). In this state, when any one of control signals on the first portions 3*a* and 4*a* of the control signal lines (3*a* and 3*b*; and 4*a* and 4*b*) becomes negated or asserted, a potential change is output to the second portions 3*b* and 4*b* via the inverters 7 and 8, thereby changing a control signal on the second portion 3*b* or 4*b*. However, the second block 2 is not operated since the second block selection signal is negated.

Table 1 is a list of block selection signals S1 and S2, control signals C1 and C2, and corresponding operation modes of the semiconductor memory device. S1 denotes a block selection signal on the first block selection signal line (5*a* and 5*b*). S2 denotes a block selection signal on the second block selection signal line (6*a* and 6*b*). C1 denotes a control signal on the first portions 3*a* and 4*a*, and C2 denotes a control signal on the second portions 3*b* and 4*b*, of the control signal lines (3*a* and 3*b*; and 4*a* and 4*b*). Let us assume that each block selection signal and each control signal is active when it is at a logical "H" (High level). In Table 1, "X" represents undefined. The same goes for other tables.

TABLE 1

| S1 | S2 | C1 | C2 | Operation mode |
|----|----|----|----|----------------|
| L  | L  | X  | X  | stand-by |
| H  | L  | L  | L  | the first block is selected but not operated |
| L  | H  | L  | L  | the second block is selected but not operated |
| H  | L  | H  | H  | the first block is operated |
| L  | H  | H  | H  | the second block is operated |

In the conventional semiconductor memory device having the repeater circuit 9 described above, the control signals on the control signal lines (3a and 3b; and 4a and 4b) are transferred to the second block 2 even when the second block 2 is not selected. Therefore, each of the control signal lines (3a and 3b; and 4a and 4b) is driven throughout its length even though each line is divided into the first portions 3a and 4a and the second portions 3b and 4b, respectively.

Thus, the capacity of each of the control signal lines (3a and 3b; and 4a and 4b) is the same as that in the case where no repeater circuit 9 is provided. As a result, in the conventional semiconductor memory device, power consumption is barely reduced even though each of the control signal lines (3a and 3b; and 4a and 4b) is divided by the repeater circuit 9.

SUMMARY OF THE INVENTION

It is an object of the present invention to at least solve the problems in the conventional technology.

A semiconductor memory device according to an aspect of the present invention includes a cell array that is divided into n blocks, where n is an integer greater than 1; a control circuit that outputs a signal to be transmitted to any one of the blocks; n signal lines including a first signal line that transmits the signal to a first block of the blocks, a second signal line that transmits the signal to a second block of the blocks, and n−2 signal lines that transmit the signal to a corresponding block of the blocks; and n−1 repeater circuits. An m-th repeater circuit, where m=1, 2, . . . , n−1, is provided between each of m-th signal line and m+1-th signal line, and includes a gate circuit that blocks the signal when the m-th block is selected.

A semiconductor memory device according to another aspect of the present invention includes a cell array that is divided into n blocks, where n is an integer greater than 1; a control circuit that outputs a signal to be transmitted to any one of the blocks; n signal lines including a first signal line that transmits the signal to a first block of the blocks, a second signal line that transmits the signal to a second block of the blocks, and n−2 signal lines that transmit the signal to a corresponding block of the blocks; and n−1 repeater circuits. An m-th repeater circuit, where m=1, 2, . . . , n−1, is provided between each of m-th signal line and m+1-th signal line, and includes a gate circuit that blocks the signal when a k-th block, where k=m+1, m+2, . . . , n, is not selected.

A semiconductor memory device according to still another aspect of the present invention includes a cell array that is divided into n blocks, where n is an integer greater than 1; a control circuit that outputs a signal to be transmitted to any one of the blocks; m signal lines, where m=2, 3, . . . , n, each of which transmits the signal to at least one block of the blocks; and a repeater circuit that is provided between a k-th signal line and a k+1-th signal line, where k=1, 2, . . . , m−1. The repeater circuit includes a gate circuit that blocks the signal when a block to which the signal is transmitted by the k-th signal line is selected.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a circuit diagram of the relevant parts of the semiconductor memory device shown in FIG. 2;

FIG. 6 is a circuit diagram of the relevant parts of a semiconductor memory device according to a second embodiment of the present invention;

DETAILED DESCRIPTION

Figure 1:
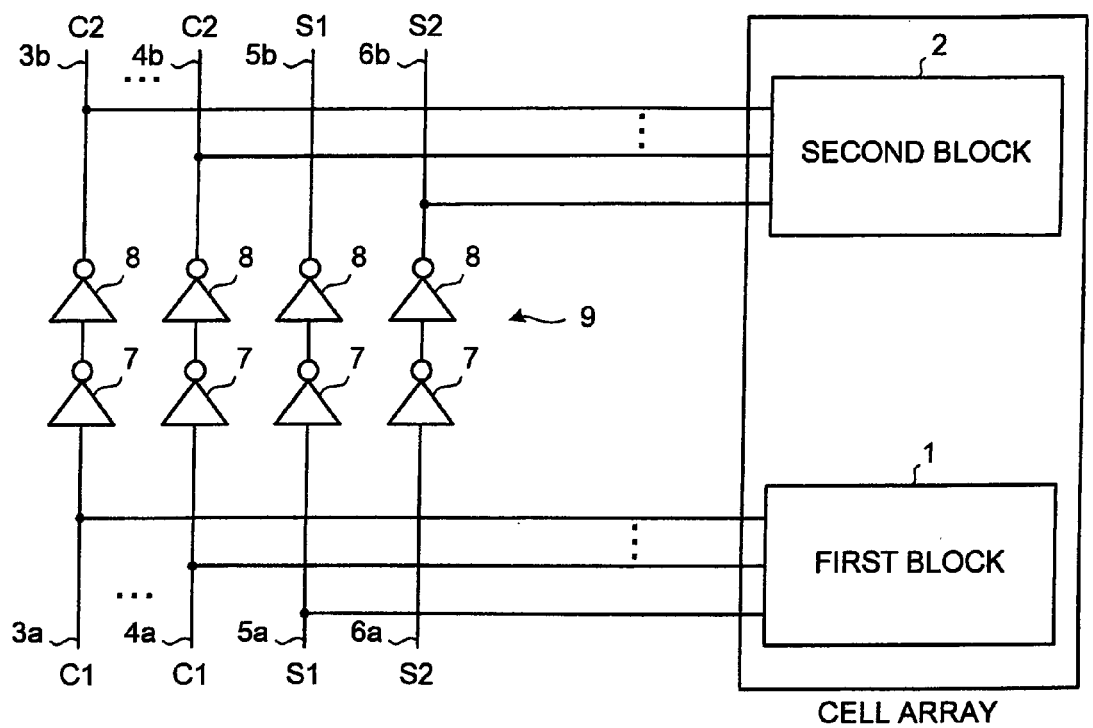
FIG. 1 is a circuit diagram of the relevant parts of a conventional semiconductor memory device.

Exemplary embodiments of the present invention are described in detail below with reference to accompanying drawings. In the following description, the same components are provided with the same reference numerals, and are not described to avoid redundant explanation.

Figure 2:
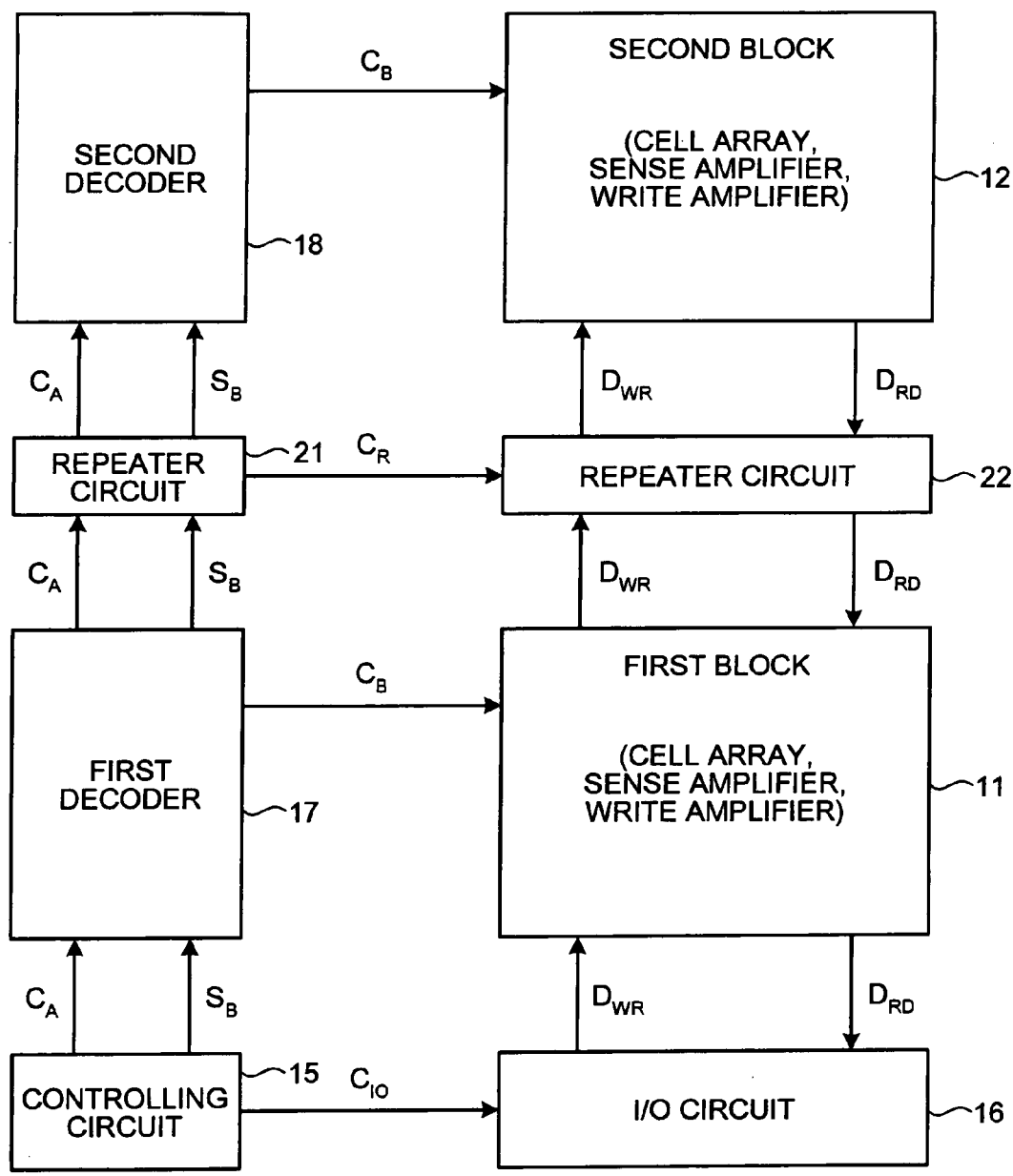
FIG. 2 is a block diagram of a semiconductor memory device according to a first embodiment of the present invention.

FIG. 2 is a block diagram of a semiconductor memory device according to a first embodiment of the present invention.

As shown in FIG. 2, the semiconductor memory device includes a first block 11, a second block 12, a control circuit 15, a data input/output (I/O) circuit 16, a first decoder 17 corresponding to the first block 11, a second decoder 18 corresponding to the second block 12, a repeater circuit 21 inserted between the first decoder 17 and the second decoder 18, and a repeater circuit 22 inserted between the first block 11 and the second block 12.

The first block 11 and the second block 12 include a divided cell array, a sense amplifier, and a write amplifier, respectively. The control circuit 15 outputs a block selection signal $S_B$ included in an externally-provided address signal. The block selection signal $S_B$ output from the control circuit 15 is transmitted via the first decoder 17 and the repeater circuit 21 to the second decoder 18. The control circuit 15 also outputs a control signal $C_A$, such as a word selection signal, a column selection signal, a read control signal, and a write control signal.

The control signal $C_A$ output from the control circuit 15 is transmitted, depending on which block is selected by the block selection signal $S_B$, to the second block 12 via the first decoder 17, the repeater circuit 21, and the second decoder 18 as a block control signal $C_A$, or to the first block 11 via the first decoder 17 as a block control signal $C_B$. The repeater circuit 21 between the decoders generates a repeater control signal $C_R$ and, based on the repeater control signal $C_R$, enables or disables an output of the control signal $C_A$ transmitted from the first decoder 17 to the second decoder 18.

The repeater control signal $C_R$ generated by the repeater circuit 21 between the decoders is transmitted to the repeater circuit 22 between the blocks for relaying write data $D_{WR}$ and read data $D_{RD}$. Based on the repeater control signal $C_R$, the repeater circuit 22 between the blocks enables or disables an output of the write data $D_{WR}$ transmitted from the first block 11 to the second block 12. The control circuit 15 also outputs an I/O control signal $C_{IO}$ to the I/O circuit 16.

Figure 3:
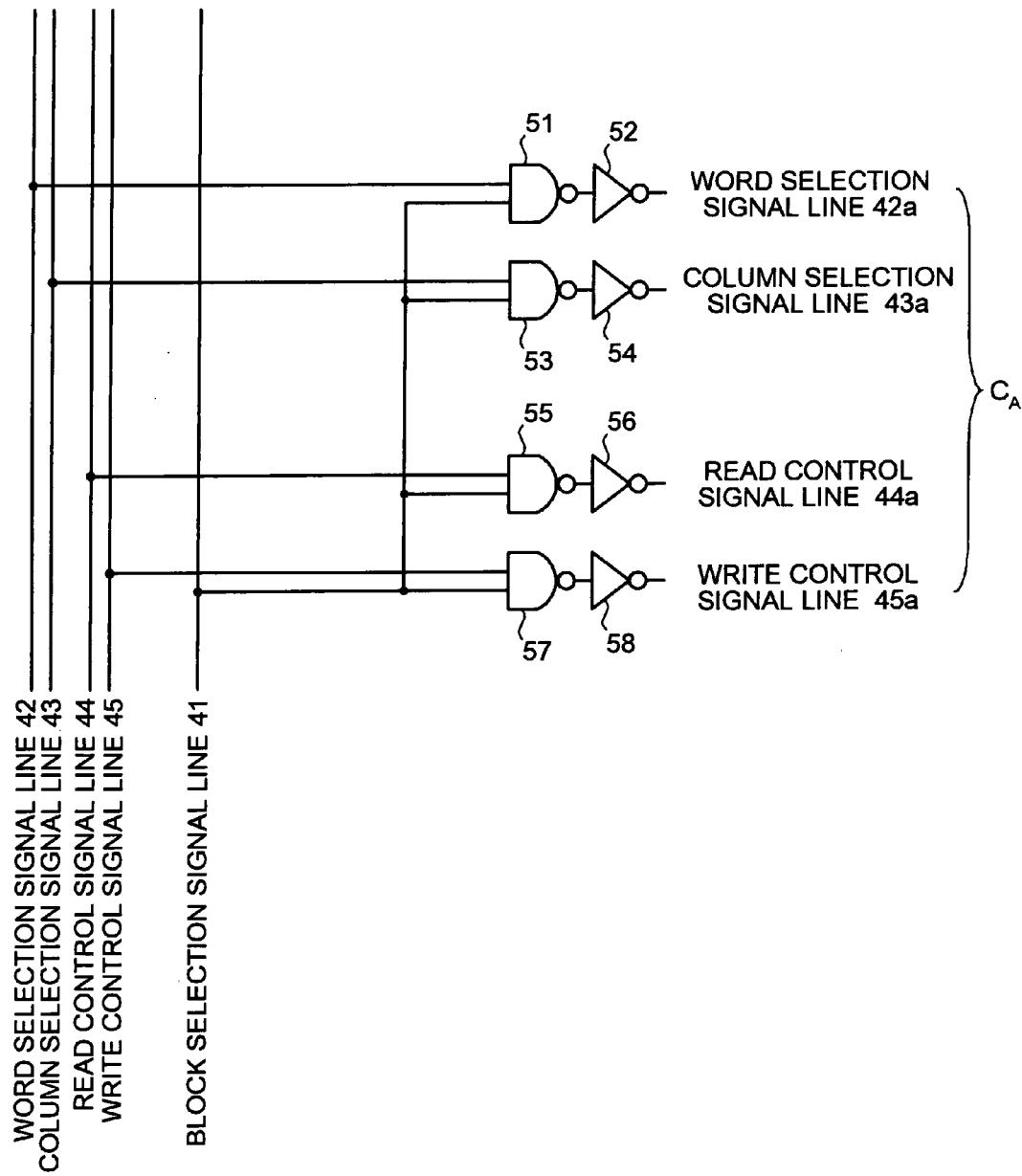
FIG. 3 is a circuit diagram of a first decoder shown in FIG. 2.

Next, the structure of the first decoder 17 and the second decoder 18 is described. Since the second decoder 18 is identical in structure to the first decoder 17, only the structure of the first decoder 17 is described. FIG. 3 is a circuit diagram of the first decoder 17. In FIG. 3, four signal lines that are input to the first decoder 17, that is, a word selection signal line 42, a column selection signal line 43, a read control signal line 44, and a write control signal line 45 are connected to one input of NAND gates 51, 53, 55, and 57, respectively. A block selection signal line 41 is connected to the other input of NAND gates 51, 53, 55, and 57. An inverter 52 is provided at an output of the NAND gate 51.

Therefore, a word selection signal, which is transmitted from the inverter 52 to the first block 11 via a word selection signal line 42a, is asserted when the word selection signal on the word selection signal line 42 is asserted with the first block selection signal on the block selection signal line 41 being asserted. The same goes for the column selection signal, the read control signal, and the write control signal. That is, a column selection signal, which is transmitted from an inverter 54 to the first block 11 via a column selection signal line 43a, is asserted when both of the column selection signal on the column selection signal line 43 and the first block selection signal on the block selection signal line 41 are asserted. A read control signal, which is transmitted from an inverter 56 to the first block 11 via a read control signal line 44a, is asserted when both of the read control signal on the read control signal line 44 and the first block selection signal on the block selection signal line 41 are asserted. A write control signal, which is transmitted from an inverter 58 to the first block 11 via a write control signal line 45a, is asserted when both of the write control signal on the write control signal line 45 and the first block selection signal on the block selection signal line 41 are asserted.

Figure 4:
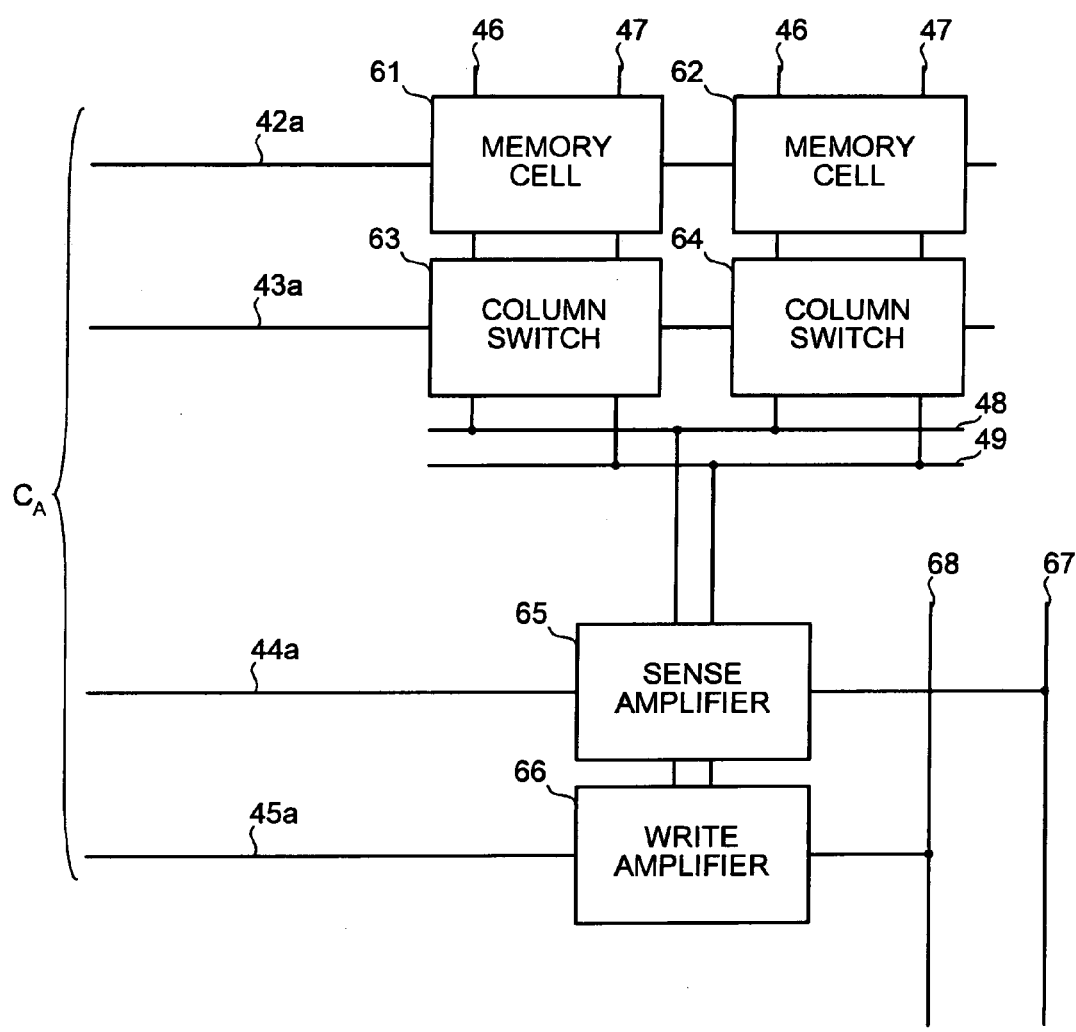
FIG. 4 is a circuit diagram of a first block shown in FIG. 2.

Next, the structure of the first block 11 and the second block 12 is described. Since the second block 12 is identical in structure to the first block 11, only the structure of the first block 11 is described. FIG. 4 is a circuit diagram of the first block 11.

In FIG. 4, the first block 11 includes a plurality of memory cells 61 and 62 disposed in a matrix format (in the drawing, two memory cells are shown), column switches 63 and 64 each provided for each column, and a sense amplifier 65 and a write amplifier 66 that are common to the memory cells 61 and 62.

In FIG. 4, two columns are exemplarily depicted. The memory cells 61 and 62 disposed for the respective columns (in the drawing, one memory cell is provided for each column) are connected to the column switches 63 and 64, respectively, via a pair of bit lines 46 and 47. The pair of bit lines 46 and 47 is connected to a pair of data bus lines 48 and 49. The sense amplifier 65 and the write amplifier 66 are connected to the data bus lines 48 and 49, respectively. The sense amplifier 65 is also connected to a read data line 67. The write amplifier 66 is also connected to a write data line 68.

Although one row is depicted in FIG. 4, a plurality of rows can be provided. The word selection signal line 42a is connected to each row. The column selection signal line 43a is connected to the column switches 63 and 64. The read control signal line 44a is connected to the sense amplifier 65. The write control signal line 45a is connected to the write amplifier 66. One row of the rows, for which the word selection signal is asserted, is selected.

The column switches 63 and 64, the sense amplifier 65, and the write amplifier 66 are driven when any one of the column selection signal, the read control signal, and the write control signal is asserted. In other words, the first block 11 is not operated when the first block selection signal on the first block selection signal line 41 is negated and thereby all the signals on the word selection signal line 42a, the column selection signal line 43a, the read control signal line 44a, and the write control signal line 45a are negated.

FIG. 5 is a circuit diagram of the relevant parts of the semiconductor memory device according to the first embodiment. Let us assume that a signal is active when it is at a High (H) level. In FIG. 5, a cell array is divided into the first block 11 and the second block 12.

N control signal lines (71a and 71b; and 72a and 72b) (only two lines are shown in FIG. 5), a first block selection signal line (73a and 73b) for selecting the first block 11, and a second block selection signal line (74a and 74b) for selecting the second block 12 are provided. That is, [n+2] signal lines are provided.

The n control signal lines (71a and 71b; and 72a and 72b) transmit the word selection signal, the column selection signal, the read control signal, the write control signal, and the like. The first block selection signal line (73a and 73b) transmits the first block selection signal, and the second block selection signal line (74a and 74b) transmits the second block selection signal.

The n control signal lines (71a and 71b; and 72a and 72b), the first block selection signal line (73a and 73b), and the second block selection signal line (74a and 74b) are respectively divided into first portions 71a, 72a, 73a, and 74a connected to the first block 11, and second portions 71b, 72b, 73b, and 74b connected to the second block 12.

The first portions 71a and 72a of the control signal lines (71a and 71b; and 72a and 72b) are respectively connected to one input terminal of NAND gates 85 and 87. A reversed signal of a signal on the first portion 73a of the first block selection signal line (73a and 73b) is input to the other input terminal of the NAND gates 85 and 87. Therefore, the control signals on the second portions 71b and 72b of the control signal lines (71a and 71b; and 72a and 72b) are not changed as long as the first block selection signal on the first portion 73a of the first block selection signal line (73a and 73b) is asserted.

The NAND gates 85 and 87 and inverters 81, 82, 83, 84, 86, and 88 form the repeater circuit 21 shown in FIG. 2. The other repeater circuit 22 is identical in structure to the repeater circuit 21 shown in FIG. 5. That is, as with the control signal line (71a and 71b), a plurality of write data lines 68 (refer to FIG. 4) are each divided into a first portion and a second portion, between which the serially-connected NAND gate 85 and the inverter 86 is inserted. The NAND gate 85 is supplied with the write data signal and the first block selection signal.

In the structure shown in FIG. 5, the first block 11 is selected when the first block selection signal is asserted. In this state, the control signals on the second portions 71b and 72b of the control signal lines (71a and 71b; and 72a and 72b) are not changed, even though any one of the control signals on the first portions 71a and 72a becomes negated or asserted.

Therefore, since the capacity of the control signal lines is reduced by the capacity of the second portions 71b and 72b, the power conventionally consumed in driving the second portions 71b and 72b can be saved. Besides, since the second block selection signal is negated, the second block 12 is not operated.

Table 2 is a list of block selection signals S1 and S2, control signals C1 and C2, and corresponding operation modes of the semiconductor memory device shown in FIG. 5. S1 denotes a block selection signal on the first block selection signal line (73a and 73b). S2 denotes a block selection signal on the second block selection signal line (74a and 74b). C1 denotes a control signal on the first portions 71a and 72a, and C2 denotes a control signal on the second portions 71b and 72b, of the control signal lines (71a and 71b; and 72a and 72b).

TABLE 2

| S1 | S2 | C1 | C2 | Operation mode |
|---|---|---|---|---|
| L | L | X | X | stand-by |
| H | L | L | L | the first block is selected but not operated |
| L | H | L | L | the second block is selected but not operated |
| H | L | H | H | the first block is operated |
| L | H | H | H | the second block is operated |

FIG. 6 is a circuit diagram of the relevant parts of a semiconductor memory device according to a second embodiment. Let us assume that a signal is active when it is at an H level.

In the first embodiment, a control signal on the first portion 71a or 72a of the control signal lines (71a and 71b; and 72a and 72b) is not output to the second portion 71b or 72b when the first block 11 is selected. On the other hand, in the second embodiment, a control signal on the first portion 71a or 72a of the control signal lines (71a and 71b; and 72a and 72b) is not output to the second portion 71b or 72b when the second block 12 is not selected.

The structure of the semiconductor memory device, the decoder, and each of the blocks 11 and 12 are identical to those in the first embodiment. In the following, only the differences from the first embodiment are described. One input terminal of the NAND gate 85 on the control signal line (71a and 71b) is connected to the first portion 71a, and one input terminal of the NAND gate 87 on the control signal line (72a and 72b) is connected to the first portion 72a. To the other input terminal of each of the NAND gates 85 and 87, the first portion 74a of the second block selection signal line (74a and 74b) is connected.

In the structure shown in FIG. 6, the control signals on the second portions 71b and 72b of the control signal lines (71a and 71b; and 72a and 72b) are not changed as long as the second block selection signal is negated (that is, while the second block 12 is not selected), even though any one of the control signals on the first portions 71a and 72a becomes negated or asserted. Therefore, as with the first embodiment, the power conventionally consumed in driving the second portions 71b and 72b can be saved. Besides, since the second block selection signal is negated, the second block 12 is not operated.

Table 3 is a list of block selection signals S1 and S2, control signals C1 and C2, and corresponding operation modes of the semiconductor memory device shown in FIG. 6. S1 denotes a block selection signal on the first block selection signal line (73a and 73b). S2 denotes a block selection signal on the second block selection signal line (74a and 74b). C1 denotes a control signal on the first portions 71a and 72a, and C2 denotes a control signal on the second portions 71b and 72b, of the control signal lines (71a and 71b; and 72a and 72b).

TABLE 3

| S1 | S2 | C1 | C2 | Operation mode |
|---|---|---|---|---|
| L | L | X | L | stand-by |
| H | L | L | L | the first block is selected but not operated |
| L | H | L | L | the second block is selected but not operated |
| H | L | H | L | the first block is operated |
| L | H | H | H | the second block is operated |

Figure 7:
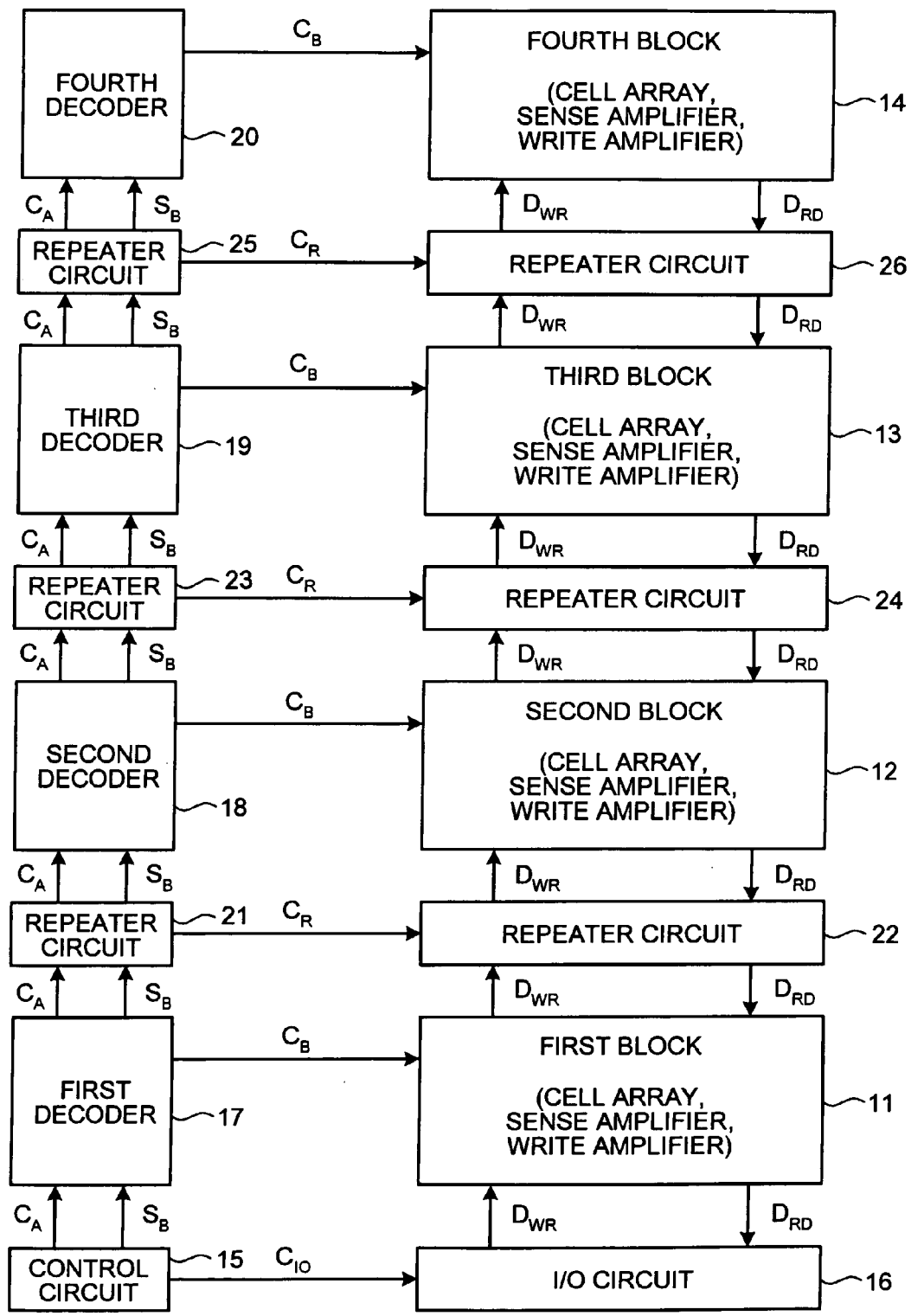
FIG. 7 is a block diagram of a semiconductor memory device according to a third embodiment of the present invention.

FIG. 7 is a block diagram of a semiconductor memory device according to a third embodiment. In the first embodiment, the cell array is divided into two blocks 11 and 12. In the third embodiment, the cell array is divided into four blocks 11, 12, 13, and 14. In the following, only the differences from the first embodiment are described.

In FIG. 7, a third block 13, a fourth block 14, a third decoder 19 corresponding to the third block 13, and a fourth decoder 20 corresponding to the fourth block 14 are added to the structure shown in FIG. 2.

Furthermore, a repeater circuit 23 is inserted between the second decoder 18 and the third decoder 19, a repeater circuit 24 is inserted between the second block 12 and the third block 13, a repeater circuit 25 is inserted between the third decoder 19 and the fourth decoder 20, and a repeater circuit 26 is inserted between the third block 13 and the fourth block 14. The structure of each of the third and fourth blocks 13 and 14 is identical to that of the first block 11 shown in FIG. 4. The structure of each of the third and fourth decoders 19 and 20 is identical to that of the first decoder 17 shown in FIG. 3.

The block selection signal $S_B$ output from the control circuit 15 is transmitted to the fourth decoder 20. The control signal $C_A$ output from the control circuit 15 is transmitted, depending on which block is selected by the block selection signal $S_B$, to any one of the first decoder 17, the second decoder 18, the third decoder 19, and the fourth decoder 20. The repeater circuits 23 and 25 between the decoders each enable or disable an output of the control signal $C_A$ as with the repeater circuit 21 between the decoders in the first embodiment. The repeater circuits 24 and 26 between the blocks each enable or disable an output of the write data $D_{WR}$ as with the repeater circuit 22 between the blocks in the first embodiment.

Figure 8:
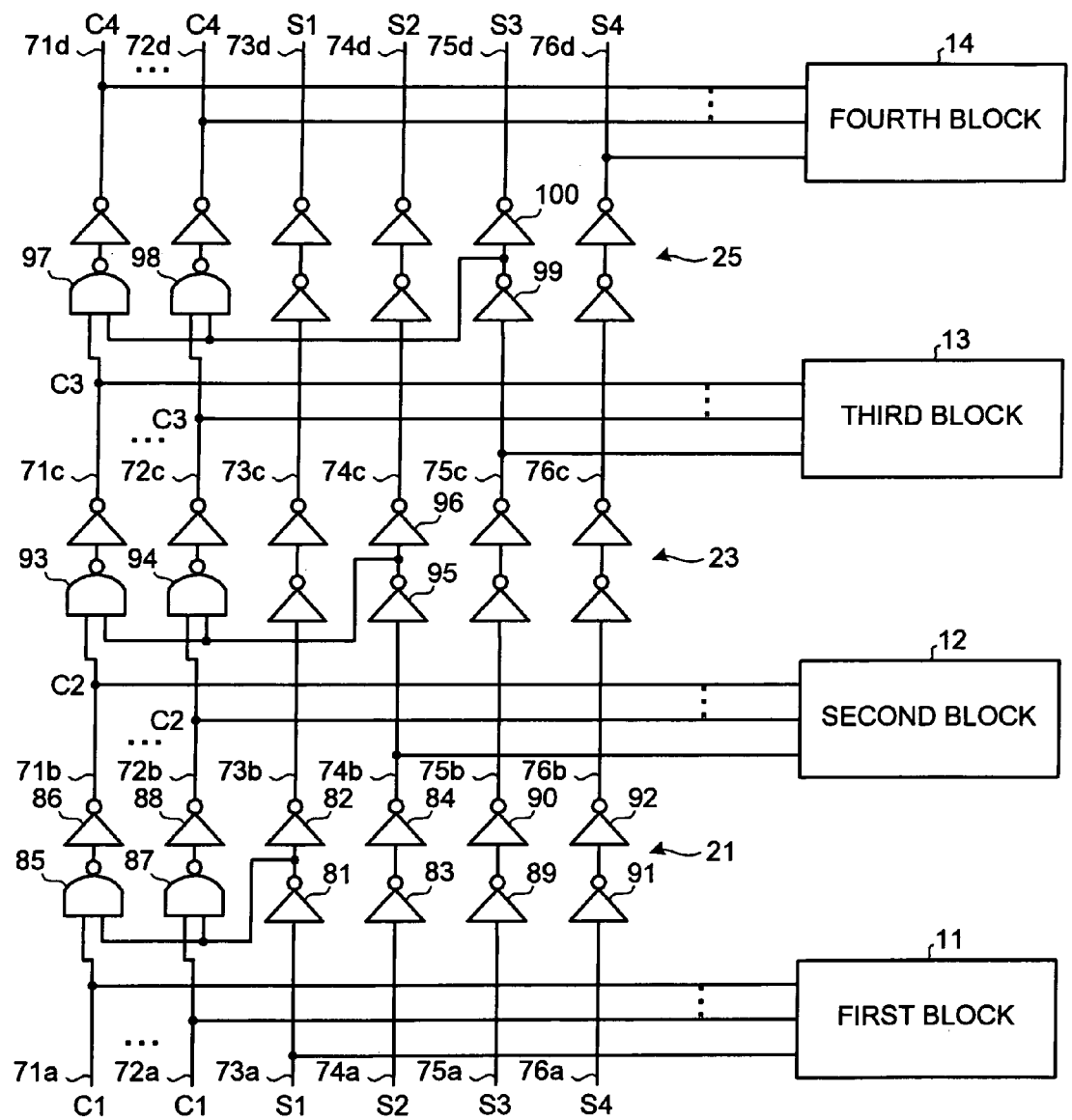
FIG. 8 is a circuit diagram of the relevant parts of a semiconductor memory device according to the third embodiment.

FIG. 8 is a circuit diagram of the relevant parts of the semiconductor memory device according to the third embodiment. Let us assume that a signal is active when it is at an H level. In FIG. 8, a third block selection signal line (75a, 75b, 75c, and 75d) for selecting the third block 13 and a fourth block selection signal line (76a, 76b, 76c, and 76d) for selecting the fourth block 14 are provided. Therefore, [n+4] signal lines are provided.

N control signal lines (71a, 71b, 71c, and 71d; and 72a, 72b, 72c, and 72d), a first block selection signal line (73a, 73b, 73c, and 73d), a second block selection signal line (74a, 74b, 74c, and 74d), the third block selection signal line (75a, 75b, 75c, and 75d), and the fourth block selection signal line (76a, 76b, 76c, and 76d) are respectively divided into first portions 71a, 72a, 73a, 74a, 75a, and 76a connected to the first block 11, second portions 71b, 72b, 73b, 74b, 75b, and 76b connected to the second block 12, third portions 71c, 72c, 73c, 74c, 75c, and 76c connected to the third block 13, and fourth portions 71d, 72d, 73d, 74d, 75d, and 76d connected to the fourth block 14.

On the third block selection signal line (75a, 75b, 75c, and 75d), the first portion 75a is connected to the control circuit 15 shown in FIG. 2 and the input terminal of a first-stage inverter 89. The output terminal of the first-stage inverter 89 is connected to the input terminal of a second-stage inverter 90. The output terminal of the second-stage inverter 90 is connected to the second portion 75b.

Similarly, on the fourth block selection signal line (76a, 76b, 76c, and 76d), the first portion 76a is connected to the control circuit 15 shown in FIG. 2 and the input terminal of a first-stage inverter 91. The output terminal of the first-stage inverter 91 is connected to the input terminal of a second-stage inverter 92. The output terminal of the second-stage inverter 92 is connected to the second portion 76b. These inverters 89, 90, 91, and 92 together with the NAND gates 85 and 87 and the inverters 81, 82, 83, 84, 86, and 88 form the repeater circuit 21 between the first decoder 17 and the second decoder 18.

The repeater circuit 23 between the second decoder 18 and the third decoder 19 and the repeater circuit 25 between the third decoder 19 and the fourth decoder 20 are identical in structure to the repeater circuit 21 between the first decoder 17 and the second decoder 18, with the exception of the following point.

In the repeater circuit 21 between the first decoder 17 and the second decoder 18, one input terminal of each of the NAND gates 85 and 87 on the control signal lines (71a, 71b, 71c, and 71d; and 72a, 72b, 72c, and 72d) is connected to a node between the inverters 81 and 82 on the first block selection signal line (73a, 73b, 73c, and 73d).

By contrast, in the repeater circuit 23 between the second decoder 18 and the third decoder 19, one input terminal of each of the NAND gates 93 and 94 on the control signal lines (71a, 71b, 71c, and 71d; and 72a, 72b, 72c, and 72d) is connected to a node between inverters 95 and 96 on the second block selection signal line (74a, 74b, 74c, and 74d).

Similarly, in the repeater circuit 25 between the third decoder 19 and the fourth decoder 20, one input terminal of each of the NAND gates 97 and 98 on the control signal lines (71a, 71b, 71c, and 71d; and 72a, 72b, 72c, and 72d) is connected to a node between inverters 99 and 100 on the third block selection signal line (75a, 75b, 75c, and 75d).

In the structure shown in FIG. 8, control signals on the second portions 71b, 72b, and thereafter of the control signal lines (71a, 71b, 71c, and 71d; and 72a, 72b, 72c, and 72d) are not changed as long as the first block 11 is selected, even though any one of control signals on the first portions 71a and 72a becomes negated or asserted.

Therefore, the second portions 71b, 72b, and thereafter are not required to be driven, thereby reducing capacity and saving on the power conventionally consumed in driving the second portions 71b, 72b, and thereafter. Besides, the second block 12, the third block 13, and the fourth block 14 are not operated as long as the first block 11 is selected.

Similarly, a potential change is not transmitted to the third portions 71c, 72c, and thereafter of the control signal lines (71a, 71b, 71c, and 71d; and 72a, 72b, 72c, and 72d) as long as the second block 12 is selected, even though any one of control signals on the first portions 71a and 72a and the second portions 71b and 72b becomes negated or asserted.

Therefore, the third portions 71c, 72c, and thereafter are not required to be driven, thereby reducing capacity and saving on the power conventionally consumed in driving the third portions 71c, 72c, and thereafter. Besides, the first block 11, the third block 13, and the fourth block 14 are not operated as long as the second block 12 is selected.

Similarly, control signals on the fourth portions 71d and 72d of the control signal lines (71a, 71b, 71c, and 71d; and 72a, 72b, 72c, and 72d) are not changed as long as the third block 13 is selected, even though any one of control signals on the first portions 71a and 72a, the second portions 71b and 72b, and the third portions 71c and 72c becomes negated or asserted.

Therefore, the fourth portions 71d and 72d are not required to be driven, thereby reducing wiring capacity and saving on the power conventionally consumed in driving the fourth portions 71d and 72d. Besides, the first block 11, the second block 12, and the fourth block 14 are not operated as long as the third block 13 is selected.

Table 4 is a list of block selection signals S1 to S4, control signals C1 to C4, and corresponding operation modes of the semiconductor memory device shown in FIG. 8. S1 denotes a block selection signal on the first block selection signal line (73a, 73b, 73c, and 73d). S2 denotes a block selection signal on the second block selection signal line (74a, 74b, 74c, and 74d). S3 denotes a block selection signal on the third block selection signal line (75a, 75b, 75c, and 75d). S4 denotes a block selection signal on the fourth block selection signal line (76a, 76b, 76c, and 76d). C1 denotes a control signal on the first portions 71a and 72a, C2 denotes a control signal on the second portions 71b and 72b, C3 denotes a control signal on the third portions 71c and 72c, and C4 denotes a control signal on the fourth portions 71d and 72d, of the control signal lines (71a, 71b, 71c and 71d; and 72a, 72b, 72c and 72d).

TABLE 4

| S1 | S2 | S3 | S4 | C1 | C2 | C3 | C4 | Operation mode |
|---|---|---|---|---|---|---|---|---|
| L | L | L | L | X | L | L | L | stand-by |
| H | L | L | L | L | L | L | L | the first block is selected but not operated |
| L | H | L | L | L | L | L | L | the second block is selected but not operated |
| L | L | H | L | L | L | L | L | the third block is selected but not operated |
| L | L | L | H | L | L | L | L | the fourth block is selected but not operated |
| H | L | L | L | H | L | L | L | the first block is operated |
| L | H | L | L | H | H | L | L | the second block is operated |
| L | L | H | L | H | H | H | L | the third block is operated |
| L | L | L | H | H | H | H | H | the fourth block is operated |

Figure 9:
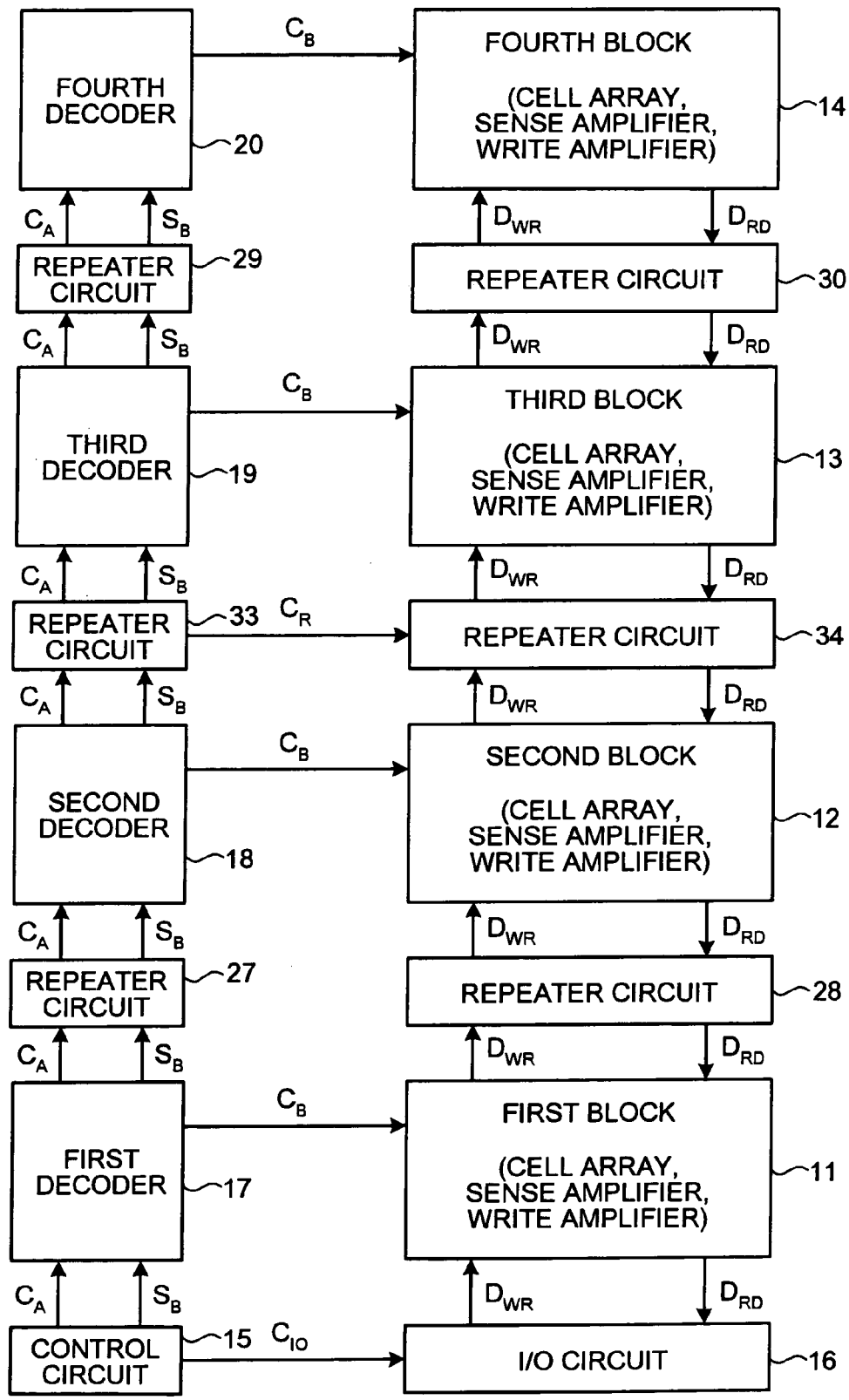
FIG. 9 is a block diagram of a semiconductor memory device according to a fourth embodiment of the present invention.

FIG. 9 is a block diagram of a semiconductor memory device according to a fourth embodiment. In the third embodiment, all repeater circuits can enable or disable an output of a control signal. By contrast, in the fourth embodiment, only a part of the repeater circuits can enable or disable outputs of a control signal and write data.

In the following, only a difference from the third embodiment is described. In FIG. 9, a repeater circuit 27 between the first decoder 17 and the second decoder 18 and the repeater circuit 28 between the first block 11 and the second block 12 output the control signal $C_A$ and the write data $D_{WR}$ as they are.

A repeater circuit 33 between the second decoder 18 and the third decoder 19 and a repeater circuit 34 between the second block 12 and the third block 13 disable or enable outputs of the control signal $C_A$ and the write data $D_{WR}$. A repeater circuit 29 between the third decoder 19 and the fourth decoder 20 and a repeater circuit 30 between the third block 13 and the fourth block 14 output the control signal $C_A$ and the write data $D_{WR}$ as they are.

Any one of three combinations of the repeater circuits, that is, a pair of repeater circuits 33 and 34, 27 and 28, and 29 and 30, can disable or enable outputs of the control signal $C_A$ and the write data $D_{WR}$.

Figure 10:
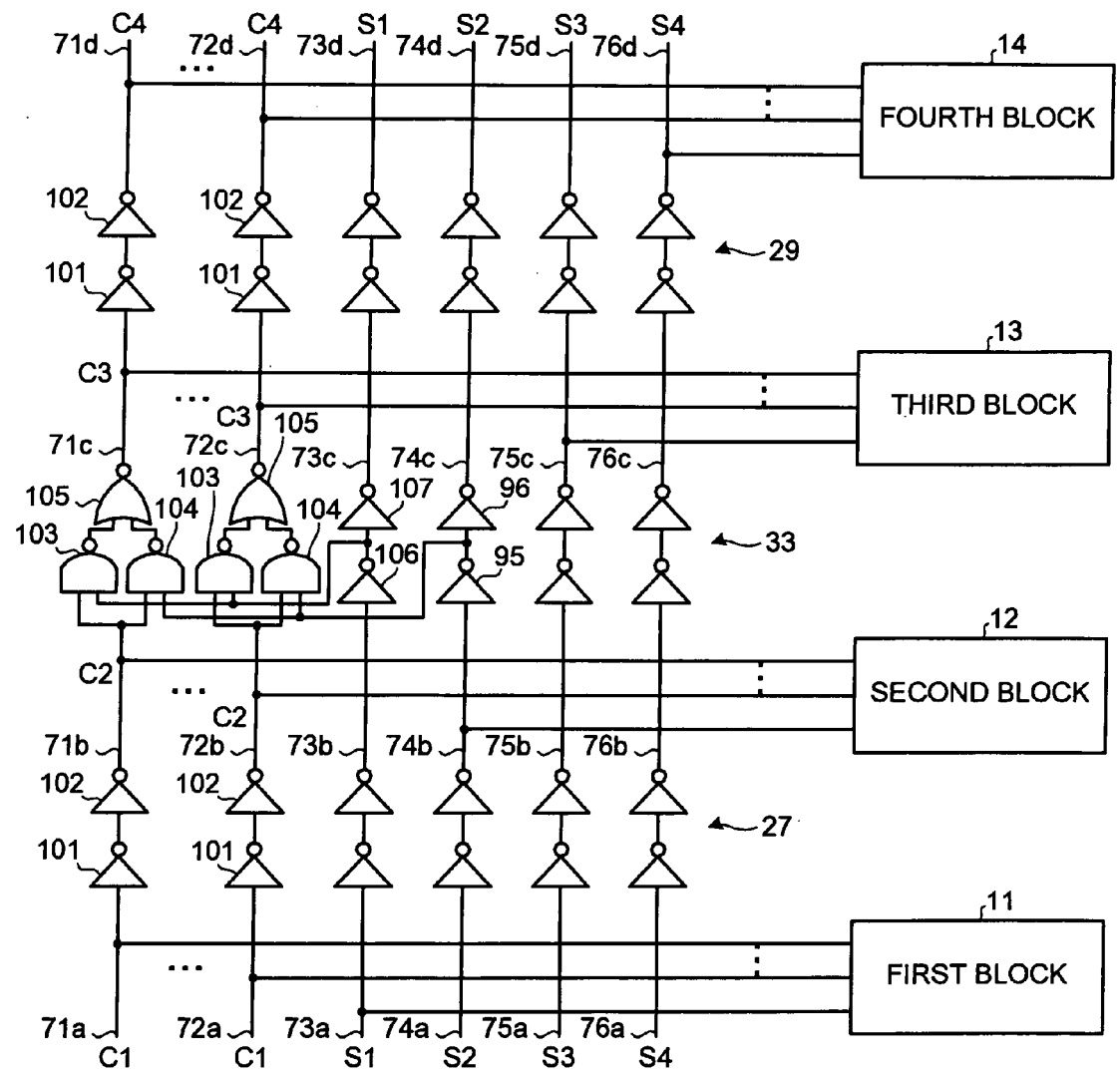
FIG. 10 is a circuit diagram of the relevant parts of the semiconductor memory device according to the fourth embodiment.

FIG. 10 is a circuit diagram of the relevant parts of the semiconductor memory device according to the fourth embodiment. Let us assume that a signal is active when it is at an H level. As shown in FIG. 10, two inverters 101 and 102 are connected in series and provided on each of the control signal lines (71a and 71b; 71c and 71d; 72a and 72b, and 72c and 72d) in a repeater circuit 27 between the first decoder 17 and the second decoder 18 and the repeater circuit 29 between the third decoder 19 and the fourth decoder 20.

By contrast, in the repeater circuit 33 between the second decoder 18 and the third decoder 19, two NAND gates 103 and 104 and a NOR gate 105 are provided on the control signal lines (71a, 71b, 71c and 71d). One input terminal of each of the NAND gates 103 and 104 is connected to a second portion 71b of the control signal line (71a, 71b, 71c and 71d). The other input terminal of the NAND gate 103 is connected to a node between inverters 106 and 107 on the first block selection signal line (73a, 73b, 73c, and 73d).

The other input terminal of the NAND gate 104 is connected to a node between inverters 95 and 96 on the second block selection signal line (74a, 74b, 74c, and 74d). Two input terminals of the NOR gate 105 are connected to output terminals of the NAND gates 103 and 104. The output terminal of the NOR gate 105 is connected to the third portion 71c of the control signal line (71a, 71b, 71c, and 71d). The same goes for the other control signal line (72a, 72b, 72c, and 72d).

In the structure shown in FIG. 10, control signals on the third portions 71c, 72c, and thereafter of the control signal lines (71a, 71b, 71c, and 71d; and 72a, 72b, 72c, and 72d) are not changed as long as the first block 11 or the second block 12 is selected, even though any one of the control signals on the first portions 71a and 72a and the second portions 71b and 72b becomes negated or asserted.

Therefore, the third portions 71c, 72c, and thereafter are not required to be driven, thereby reducing wiring capacity and saving on the power conventionally consumed in driving the third portions 71c, 72c, and thereafter. Besides, the second block 12, the third block 13, and the fourth block 14 are not operated as long as the first block 11 is selected. Similarly, the first block 11, the third block 13, and the fourth block 14 are not operated as long as the second block 12 is selected. The fourth embodiment has an advantage in that a propagation speed of the control signal is higher than that of the third embodiment.

Table 5 is a list of block selection signals S1 to S4, control signals C1 to C4, and corresponding operation modes of the semiconductor memory device shown in FIG. 10. S1 denotes a block selection signal on the first block selection signal line (73a, 73b, 73c, and 73d). S2 denotes a block selection signal on the second block selection signal line (74a, 74b, 74c, and 74d). S3 denotes a block selection signal on the third block selection signal line (75a, 75b, 75c, and 75d). S4 denotes a block selection signal on the fourth block selection signal line (76a, 76b, 76c, and 76d). C1 denotes a control signal on the first portions 71a and 72a, C2 denotes a control signal on the second portions 71b and 72b, C3 denotes a control signal on the third portions 71c and 72c, and C4 denotes a control signal on the fourth portions 71d and 72d, of the control signal lines (71a, 71b, 71c and 71d; and 72a, 72b, 72c and 72d).

TABLE 5

| S1 | S2 | S3 | S4 | C1 | C2 | C3 | C4 | Operation mode |
|---|---|---|---|---|---|---|---|---|
| L | L | L | L | X | L | L | L | stand-by |
| H | L | L | L | L | L | L | L | the first block is selected but not operated |
| L | H | L | L | L | L | L | L | the second block is selected but not operated |
| L | L | H | L | L | L | L | L | the third block is selected but not operated |
| L | L | L | H | L | L | L | L | the fourth block is selected but not operated |
| H | L | L | L | H | L | L | L | the first block is operated |
| L | H | L | L | H | H | L | L | the second block is operated |
| L | L | H | L | H | H | H | L | the third block is operated |
| L | L | L | H | H | H | H | H | the fourth block is operated |

In the repeater circuit 33 between the second decoder 18 and the third decoder 19, a NAND gate can be provided at the first stage and an inverter can be provided at the second stage (refer to FIG. 8) in place of the NAND gates 103 and 104 and the NOR gate 105. In this case, an OR gate is provided to cause a logical OR of the outputs from the inverters 106 and 107 to be input as a repeater control signal to the NAND gate at the first stage. Such a single control signal by the OR gate is particularly preferable as a repeater control signal to be supplied to the second block 12 and the third block 13 because the transmission distance of this repeater control signal is long.

In the structure shown in FIG. 10, the first block 11, the second block 12, the third block 13, and the fourth block 14 can be further divided into two blocks respectively, and some blocks and their corresponding decoders can have a repeater circuit inserted therebetween, and others cannot have a repeater circuit inserted therebetween. Furthermore, only part of the inserted repeater circuits can disable or enable outputs of a control signal and write data. This structure is effective when the number of blocks is large.

Figure 11:
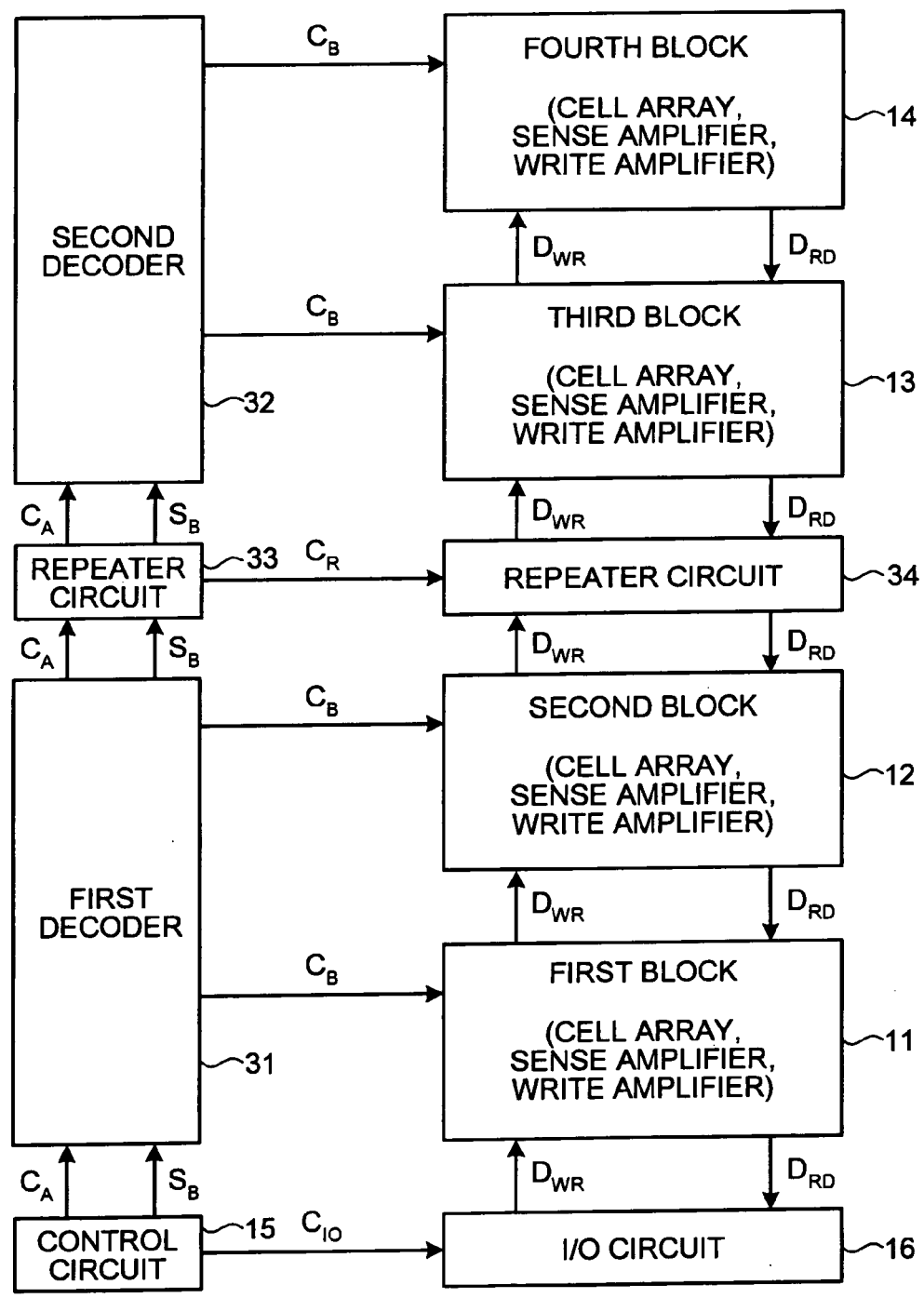
FIG. 11 is a block diagram of a semiconductor memory device according to a fifth embodiment of the present invention.

FIG. 11 is a block diagram of a semiconductor memory device according to a fifth embodiment. In the third embodiment, a repeater circuit is provided for every pair of two adjacent blocks. By contrast, in the fifth embodiment, a repeater circuit is provided only to part of such pairs.

In FIG. 11, a first decoder 31 is connected to the first block 11 and the second block 12, and a second decoder 32 is connected to the third block 13 and the fourth block 14. The repeater circuit 33 that disables or enables an output of the control signal $C_A$ is provided between the first decoder 31 and the second decoder 32. The repeater circuit 34 that disables or enables an output of the write data $D_{WR}$ is provided between the second block 12 and the third block 13.

Figure 12:
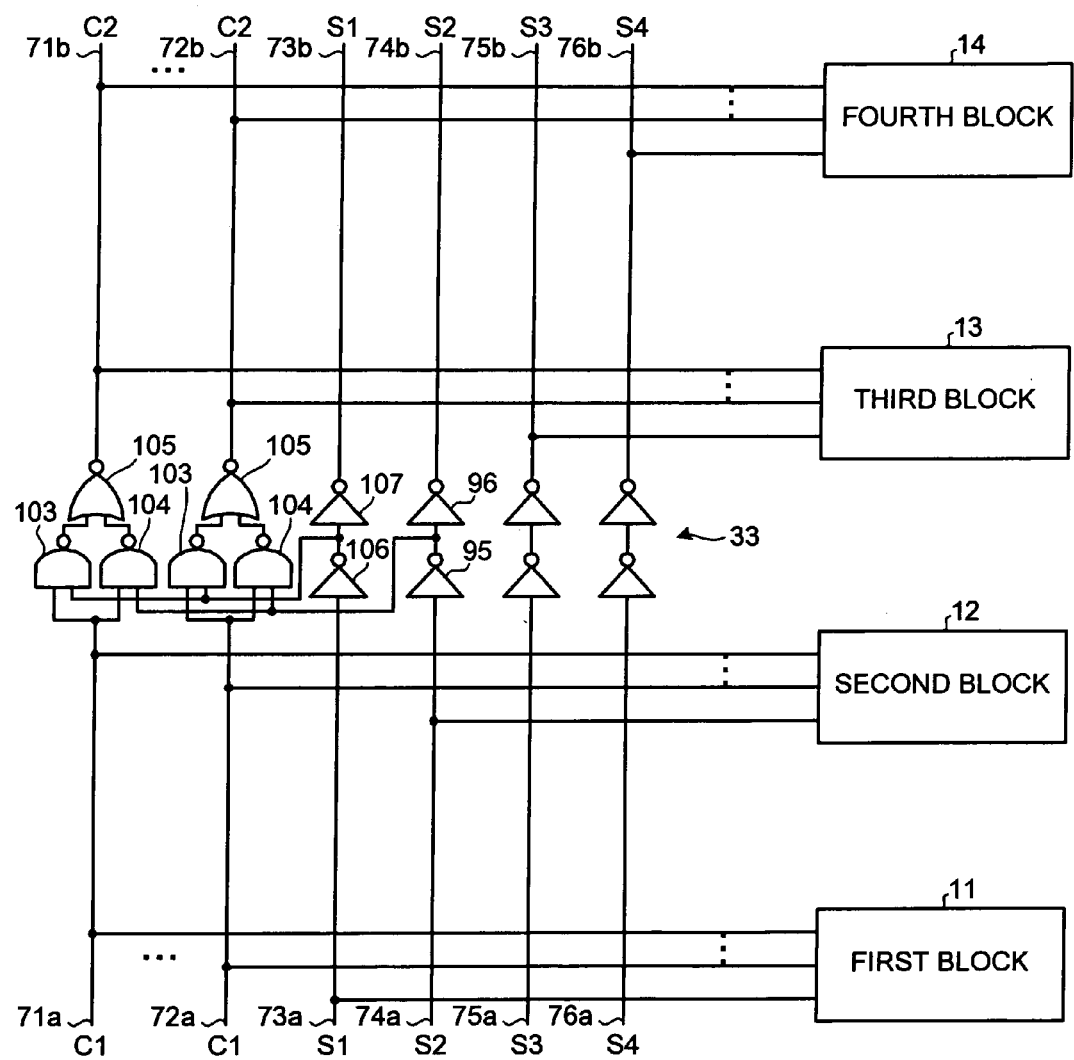
FIG. 12 is a circuit diagram of the relevant parts of a semiconductor memory device according to the fifth embodiment.

FIG. 12 is a circuit diagram of the relevant parts of the semiconductor memory device according to the fifth embodiment. Let us assume that a signal is active when it is at an H level. In FIG. 12, the structure of the repeater circuit 33 between the first decoder 31 and the second decoder 32 is as described in the fourth embodiment with reference to FIG. 10.

In the structure shown in FIG. 12, control signals on the second portions 71b and 72b of the control signal lines (71a, and 71b; and 72a and 72b) are not changed as long as the first block 11 or the second block 12 is selected, even though any one of the control signals on the first portions 71a and 72a becomes negated or asserted.

Therefore, the second portions 71b and 72b are not required to be driven, thereby reducing capacity and saving on the power conventionally consumed in driving the second portions 71b and 72b. Besides, the second block 12, the third block 13, and the fourth block 14 are not operated as long as the first block 11 is selected. The first block 11, the third block 13, and the fourth block 14 are not operated as long as the second block 12 is selected.

Table 6 depicts a list of block signals S1 to S4, control signals C1 and C2, and corresponding operation modes of the semiconductor memory device shown in FIG. 12. S1 denotes a block selection signal on the first block selection signal line (73a and 73b). S2 denotes a block selection signal on the second block selection signal line (74a and 74b). S3 denotes a block selection signal on the third block selection signal line (75a and 75b). S4 denotes a block selection signal on the fourth block selection signal line (76a and 76b). C1 denotes a control signal on the first portions 71a and 72a, and C2 denotes a control signal on the second portions 71b and 72b, of the control signal lines (71a and 71b; and 72a and 72b).

TABLE 6

| S1 | S2 | S3 | S4 | C1 | C2 | Operation mode |
|----|----|----|----|----|----|----------------|
| L  | L  | L  | L  | X  | L  | stand-by |
| H  | L  | L  | L  | L  | L  | the first block is selected but not operated |
| L  | H  | L  | L  | L  | L  | the second block is selected but not operated |
| L  | L  | H  | L  | L  | L  | the third block is selected but not operated |
| L  | L  | L  | H  | L  | L  | the fourth block is selected but not operated |
| H  | L  | L  | L  | H  | L  | the first block is operated |
| L  | H  | L  | L  | L  | H  | the second block is operated |
| L  | L  | H  | L  | H  | H  | the third block is operated |
| L  | L  | L  | H  | H  | H  | the fourth block is operated |

The control signal and the block selection signal can be active when they are at a logical "L" (Low level). Furthermore, the number of blocks is not restricted to two or four.

According to the present invention, reduction in power consumption can be achieved with a simple circuit structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising:
a cell array that is divided into n blocks, where n is an integer greater than 1;
a control circuit that outputs a signal to be transmitted to any one of the blocks;
n signal lines including a first signal line that transmits the signal to a first block of the blocks, a second signal line that transmits the signal to a second block of the blocks, and n−2 signal lines that transmit the signal to a corresponding block of the blocks; and
n−1 repeater circuits, wherein an m-th repeater circuit, where m=1, 2, . . . , n−1, is provided between each of m-th signal line and m+1-th signal line, wherein an m-th repeater circuit includes a gate circuit that blocks the signal when the m-th block is selected.

2. The semiconductor memory device according to claim 1, wherein the gate circuit outputs the signal to an m+1-th signal line when a k-th block, where k=m+1, m+2, . . . , n, is selected.

3. The semiconductor memory device according to claim 1, wherein the gate circuit blocks the signal based on a block selection signal for selecting any one of the blocks.

4. The semiconductor memory device according to claim 1, wherein each block is not operated when not selected.

5. A semiconductor memory device comprising:
a cell array that is divided into n blocks, where n is an integer greater than 1;
a control circuit that outputs a signal to be transmitted to any one of the blocks;
n signal lines including a first signal line that transmits the signal to a first block of the blocks, a second signal line that transmits the signal to a second block of the blocks, and n−2 signal lines that transmit the signal to a corresponding block of the blocks; and
n−1 repeater circuits, wherein an m-th repeater circuit, where m=1, 2, . . . , n−1, is provided between each of m-th signal line and m+1-th signal line, wherein the m-th repeater circuit includes a gate circuit that blocks the signal when a k-th block, where k=m+1, m+2, . . . , n, is not selected.

6. The semiconductor memory device according to claim 5, wherein the gate circuit outputs the signal to the m+1-th signal line when a k-th block, where k=m+1, m+2, . . . , n, is selected.

7. The semiconductor memory device according to claim 5, wherein the gate circuit blocks the signal based on a block selection signal for selecting any one of the blocks.

8. The semiconductor memory device according to claim 5, wherein each block is not operated when not selected.

9. A semiconductor memory device comprising:
a cell array that is divided into n blocks, where n is an integer greater than 1;
a control circuit that outputs a signal to be transmitted to any one of the blocks;
m signal lines, where m=2, 3, . . . , n, each of which transmits the signal to at least one block of the blocks; and
a repeater circuit that is provided between a k-th signal line and a k+1-th signal line, where k=1, 2, . . . , m−1, wherein
the repeater circuit includes a gate circuit that blocks the signal when a block to which the signal is transmitted by the k-th signal line is selected.

10. The semiconductor memory device according to claim 9, wherein the gate circuit outputs the signal to the k+1-th signal line when a block to which the signal is transmitted by the k+1-th signal line is selected.

11. The semiconductor memory device according claim 9, further comprising another repeater circuit that does not include the gate circuit and outputs the signal irrespective of which block is selected.

12. The semiconductor memory device according to claim 9, wherein the gate circuit blocks the signal based on a block selection signal for selecting any one of the blocks.

13. The semiconductor memory device according to claim 9, wherein each block is not operated when not selected.

* * * * *